(12) United States Patent
Van Zwet et al.

(10) Patent No.: US 7,245,357 B2
(45) Date of Patent: Jul. 17, 2007

(54) LITHOGRAPHIC APPARATUS AND DEVICE MANUFACTURING METHOD

(75) Inventors: Erwin Van Zwet, Delfgauw (NL); Jan Van Elp, Delft (NL); Johannes Hubertus Josephina Moors, Helmond (NL); Hendrik Antony Johannes Neerhof, Eindhoven (NL); Joost Jeroen Ottens, Veldhoven (NL); Adrianus Mathijs Maria De Groof, Geldrop (NL); Leo Wilhelmus Maria Kuipers, Eindhoven (NL); Peter Theodorus Maria Giesen, The Hague (NL); Marco Le Kluse, Maassluis (NL)

(73) Assignee: ASML Netherlands B.V., Veldhoven (NL)

( * ) Notice: Subject to any disclaimer, the term of this patent is extended or adjusted under 35 U.S.C. 154(b) by 94 days.

(21) Appl. No.: 10/734,642

(22) Filed: Dec. 15, 2003

(65) Prior Publication Data

US 2005/0128459 A1    Jun. 16, 2005

(51) Int. Cl.
*G03B 27/58* (2006.01)
*G03B 27/62* (2006.01)
*H01T 23/00* (2006.01)

(52) U.S. Cl. .................... 355/72; 355/75; 361/234

(58) Field of Classification Search ............... 355/53, 355/72–76; 310/10, 12; 318/649; 361/230–234; 378/34, 35
See application file for complete search history.

(56) References Cited

U.S. PATENT DOCUMENTS

| | | | |
|---|---|---|---|
| 4,522,489 A | | 6/1985 | Bouwer |
| 4,969,168 A | | 11/1990 | Sakamoto et al. |
| 5,315,473 A | * | 5/1994 | Collins et al. ............... 361/234 |
| 5,413,360 A | * | 5/1995 | Atari et al. .................. 279/128 |
| 5,436,790 A | * | 7/1995 | Blake et al. ................. 361/234 |
| 5,530,616 A | * | 6/1996 | Kitabayashi et al. ........ 361/234 |
| 5,583,786 A | | 12/1996 | Needham |
| 5,610,683 A | * | 3/1997 | Takahashi ..................... 355/53 |
| 5,838,529 A | | 11/1998 | Shufflebotham et al. |
| 5,880,922 A | * | 3/1999 | Husain ....................... 361/234 |
| 6,055,150 A | | 4/2000 | Clinton et al. |
| 6,075,375 A | * | 6/2000 | Burkhart et al. ............ 324/758 |
| 6,084,938 A | * | 7/2000 | Hara et al. .................... 378/34 |
| 6,134,096 A | * | 10/2000 | Yamada et al. ............. 361/234 |
| 6,169,652 B1 | * | 1/2001 | Klebanoff ................... 361/234 |

(Continued)

FOREIGN PATENT DOCUMENTS

EP    0 607 043 A1    7/1994

(Continued)

OTHER PUBLICATIONS

International Search Report and Written Opinion issued for PCT Application No. PCT/NL2004/000826, dated Nov. 3, 2005.

*Primary Examiner*—Henry Hung Nguyen
(74) *Attorney, Agent, or Firm*—Pillsbury Winthrop Shaw Pittman LLP

(57) ABSTRACT

A lithographic apparatus is disclosed. The lithographic apparatus includes an illumination system for providing a beam of radiation on a flat article to be placed in a beam path of the beam of radiation, and an article handler for handling the article during placement or removal of the article. The article handler includes an electrode and a dielectric layer in order to form an electrostatic clamp for electrostatically clamping the article.

20 Claims, 4 Drawing Sheets

U.S. PATENT DOCUMENTS

| | | | |
|---|---|---|---|
| 6,185,085 B1 * | 2/2001 | Hwang et al. | 361/234 |
| 6,215,642 B1 | 4/2001 | Sogard | |
| 6,351,367 B1 * | 2/2002 | Mogi et al. | 361/234 |
| 6,361,313 B1 | 3/2002 | Beyaert et al. | |
| 6,377,060 B1 | 4/2002 | Burkhart et al. | |
| 6,404,483 B1 | 6/2002 | Segers et al. | |
| 6,480,369 B1 | 11/2002 | Kirschstein et al. | |
| 6,522,519 B1 * | 2/2003 | Hirayanagi | 361/234 |
| 6,556,414 B2 * | 4/2003 | Kosakai | 361/234 |
| 6,606,234 B1 * | 8/2003 | Divakar | 361/234 |
| 6,721,035 B1 | 4/2004 | Segers et al. | |
| 6,839,217 B1 * | 1/2005 | Larsen | 361/234 |
| 2002/0008954 A1 | 1/2002 | Leeser | |
| 2002/0036373 A1 | 3/2002 | Kosakai | |
| 2002/0101956 A1 | 8/2002 | Hara et al. | |
| 2002/0109954 A1 | 8/2002 | Tsuruta | |
| 2002/0145714 A1 | 10/2002 | Hirayanagi | |
| 2003/0038114 A1 | 2/2003 | Howald | |
| 2003/0155080 A1 | 8/2003 | Chen et al. | |
| 2004/0012767 A1 | 1/2004 | Van Elp et al. | |

FOREIGN PATENT DOCUMENTS

| | | |
|---|---|---|
| EP | 0 947 884 A2 | 10/1999 |
| EP | 0 947 884 A3 | 7/2001 |
| EP | 1 359 469 A1 | 11/2003 |
| EP | 1 391 786 A1 | 2/2004 |
| WO | WO00/30172 | 5/2000 |
| WO | WO 02/101377 A1 | 12/2002 |

* cited by examiner

LITHOGRAPHIC APPARATUS AND DEVICE MANUFACTURING METHOD

BACKGROUND OF THE INVENTION

1. Field of Invention

The present invention relates generally to a lithographic apparatus and a device manufacturing method. More specifically, the invention relates to a lithographic apparatus that includes an article handler.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

In lithographic processing, passing the projection beam through gas compositions that are present between the illumination system and the articles to be illuminated, in particular non-homogenous gas compositions, may cause undesired effects, such as diffraction and refraction. These effects may have an adverse effect on illumination quality, in particular on a required resolution to be reached for the ever increasing demand in imaging performance. A new generation of lithography, EUV-lithography, which uses a projection beam in the Extreme Ultraviolet area, operates in (near) vacuum conditions in order to allow the projection beam of radiation to pass substantially unhindered to an article to be placed in the beam.

In the context of this application, the "article" may be a wafer, reticle, mask, or substrate, or more specifically, a substrate to be processed in manufacturing devices employing lithographic projection techniques, or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

The above described vacuum technology offers challenges in terms of handling the article. Conventionally, in non-vacuum systems, such article handlers may comprise an ejecting pin mechanism (e-pin) wherein the contact surface of the pin is provided with a vacuum clamp which generates a vacuum suction force during handling of the article. By applying a vacuum force, the article can be clamped tight to the ejection pins, thus providing a reliable connection which guarantees a known position of the wafer during all phases of the handling process.

In vacuum working conditions, a vacuum clamp will no longer be effective and will loose its function. As an alternative to vacuum clamping, a known method of clamping is an electrical clamping method wherein a current is applied from the article handler to the article. In the gap between the handler and the article, an electric attraction force is created which is in the art known as a Johnson-Rahbek (JR) clamping force. Due to a build up of this JR-effect, the method is not very fast and results in delays in clamping which may render handling of the article quite inefficient. Furthermore, the JR-currents may cause thermal expansion effects which may be unfavorable to image resolution.

BRIEF SUMMARY

It is an aspect of embodiments of the invention to provide a lithographic apparatus comprising: an illumination system for providing a projection beam of radiation on a flat article to be placed in a beam path of the projection beam of radiation; and an article handler for handling the article during placement or removal of the article, the article handler arranged to provide a clamping force between the article handler and the article to be handled.

It is another aspect of embodiments of the invention to provide a new clamping method which offers fast clamping and which offers a clamping pressure that is sufficient for reliably handling the article.

According to a further aspect of the invention, there is provided a lithographic apparatus that includes an illumination system to provide a beam of radiation on a flat article to be placed in a beam path of said beam of radiation, and an article handler to handle the article during placement or removal of the article. The article handler comprises an electrode and a dielectric layer in order to form an electrostatic clamp to electrostatically clamp the article.

In particular, by a lithographic apparatus wherein the article handler comprises an electrode and a dielectric layer in order to form an electrostatic clamp for electrostatically clamping the article, clamping can be performed by electrostatic clamping.

It is noted that known electrostatic clamps for electrostatically clamping an article to an article support suffer from dielectric layers that are too thick to apply for the article handler, since an article handler offers only a limited area of contact (diameter 0.3-10 mm) and therefore requires much higher clamping pressures. To this end, a single movable clamp having a relatively large clamping area is known, from WO-0030172. Advantageously, the article handler comprises at least three mutually distanced contact members for contacting the article to keep the contact area limited, preferably to as much as 80 mm$^2$.

Advantageously, the lithographic apparatus is provided with a presence detector for detecting a presence of the article through a measured capacity formed by the electrode, the dielectric layer and the article to be handled. An article handler thus equipped may easily provide feedback on the status of the handler, for instance, whether the handler is loaded or not and whether a contact is well established between the article and article handler. It is noted that for a JR-clamping, the currents of the JR-clamping are very low due to the generally insulating properties of the articles to be clamped (specifically, substrates covered with an $SiO_2$ layer), which forms problems for presence detection of the article.

The dielectric layer may comprise an oxide layer, for example, provided, for example, by thermal oxidation of the electrode. Preferably, the dielectric layer has a thickness of less than about 50 microns, and the dielectric constant is preferably larger than about 3. In a specific example, the dielectric layer has a thickness in the ranges between about 1 and about 5 microns, and has a dielectric constant of about 4. Furthermore, the electrostatic clamp is preferably designed to provide a clamping pressure larger than about $1.10^4$ Pa, and the article handler comprises two electrodes.

In one preferred embodiment, the electrodes are formed by an Si layer that is bonded on an isolator. Such layers may be shaped with well known thin layer techniques, such as Reactive Ion Etching or other micromachining methods. In such an embodiment, the isolator may comprise a substrate comprising an $SiO_2$ layer or a machined isolating substrate, such as Pyrex, Zerodur, fused silica, etc. Furthermore, the electrode may comprise a metal pad bonded to the electrode in order to form a terminal for wiring the electrode. The metal pad may be formed by an Al layer that is bonded to the electrode.

The invention is further related to a method of providing an electrostatic clamp for an article handler. In particular, by providing a conducting layer on an isolator; forming an electrode from the conducting layer by reactive ion etching; providing a hole in the isolator to form a terminal on the electrode; oxidizing the electrode so as to form a dielectric layer thereon; removing the oxide from the terminal; and applying wiring through the hole to the terminal, a number of possibilities are offered for achieving the required dimensions of the electrostatic clamp. In particular, by the method according to embodiments of the invention, the desired thin layered electrode structure may be provided conveniently. Preferably, the method further comprises covering the terminal with a metal layer.

Furthermore, the embodiments of the invention also relate to a device manufacturing method. The device manufacturing method includes providing a substrate; handling the substrate by an article handler provided with an electrostatic clamp; detecting a presence of the substrate by detecting a capacity formed by the electrostatic clamp and the substrate; providing a beam of radiation using an illumination system; using a patterning structure to impart the projection beam with a pattern in its cross-section; and projecting, upon detecting the presence of the substrate, the patterned beam of radiation onto a target portion of the substrate.

Other embodiments of the invention relate to a lithographic apparatus that includes an illumination system that provides a beam of radiation to an article; a support that supports the article; an article handler configured to handle the article during placement of the article on, and removal of the article from, the support; and an electrostatic clamp configured to clamp the article to the article handler. The electrostatic clamp includes an electrode and a dielectric layer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning structure may be transmissive or reflective. Examples of the patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of the patterning structure, the support structure may be a frame or table, for example, which may be fixed or movable as required and which may ensure that the patterning means is at a desired position, for example with respect to the projection system. Any use of the terms "reticle" or "mask" herein may be considered synonymous with the more general term of "patterning structure".

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

In the drawings, like or corresponding parts are referenced by the same reference numerals.

DETAILED DESCRIPTION OF EMBODIMENTS OF THE INVENTION

Figure 1:
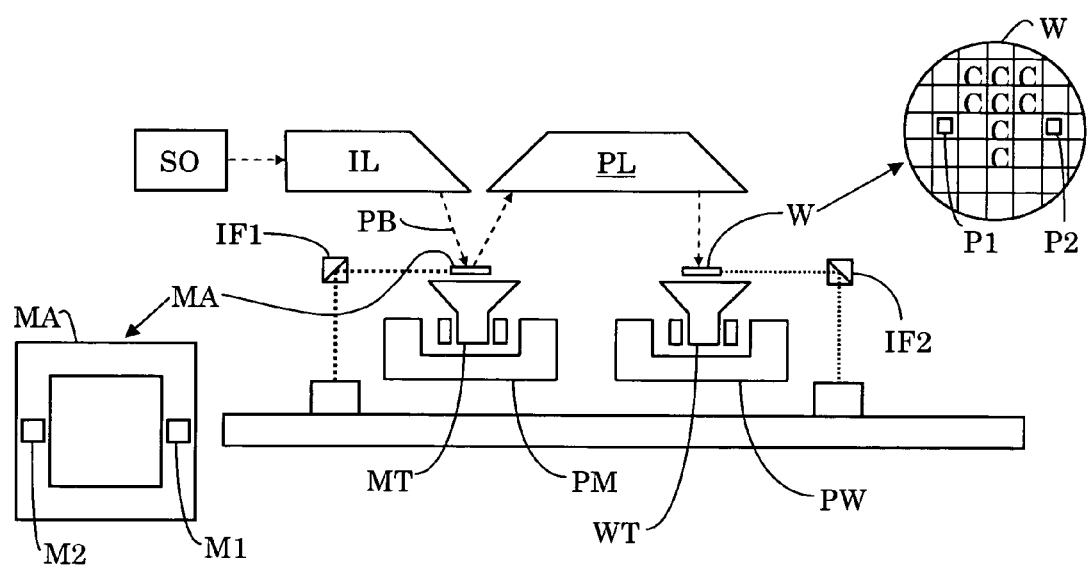
FIG. 1 depicts a lithographic apparatus according to an embodiment of the invention.

FIG. 1 schematically depicts a lithographic apparatus according to a particular embodiment of the invention. The apparatus comprises: an illumination system (illuminator) IL for providing a projection beam PB of radiation (e.g. UV or EUV radiation); a first support structure (e.g. a mask table) MT for supporting a patterning structure (e.g. a mask) MA and connected to a first positioning device PM for accurately positioning the patterning structure with respect to item PL; a substrate table (e.g. a wafer table) WT for holding a substrate (e.g. a resist coated wafer) W and connected to a second positioning device PW for accurately positioning the substrate with respect to item PL; and a projection system (e.g. a reflective projection lens) PL for imaging a pattern imparted to the projection beam PB by the patterning structure MA onto a target portion C (e.g. comprising one or more dies) of the substrate W.

Figure 2:
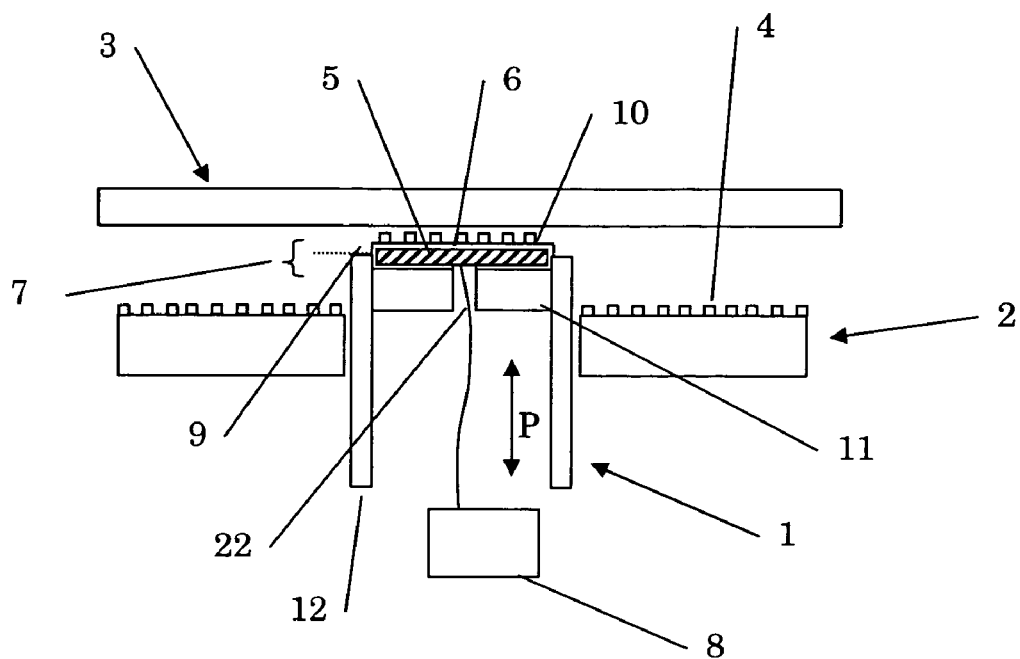
FIG. 2 depicts a schematic of an article handler according to an embodiment of the invention.

In the arrangement of FIG. 1, the article handler (not shown in the picture) is integrated in the mask table MT and/or in the wafer table WT, and is designed to handle the article during placement or removal of the article on or from the mask table MT and/or wafer table WT, as is further depicted in FIG. 2. In order to secure the article, such as a wafer or mask, to the article handler during manipulations, a clamping force is provided between the article handler and the article to be handled.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus, and the radiation beam is generally passed from the source SO to the illuminator IL with the aid of a radiation collector comprising, for example, suitable collecting mirrors and/or a spectral purity filter. In other cases, the source may be an integral part of the apparatus, for example, when the source is a mercury lamp. The source SO and the illuminator IL, may be referred to as a radiation system.

The illuminator IL may comprise an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g., so as to position different target portions C in the path of the beam PB. Similarly, the first positioning device PM and position sensor IF1 can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning means, and the substrate table WT is moved or scanned while a pattern imparted to the projection beam is projected onto a target portion C. In this mode, generally a pulsed radiation source is employed and the programmable patterning means is updated as required after each movement of the substrate table WT or in between successive radiation pulses during a scan. This mode of operation can be readily applied to maskless lithography that utilizes programmable a patterning device, such as a programmable mirror array of a type as referred to above.

Combinations and/or variations on the above described modes of use or entirely different modes of use may also be employed.

FIG. 2 depicts a schematic embodiment of an article handler 1 according to an embodiment of the invention. In the example shown in the figure, the article handler 1 is integrated in a wafer table 2. The wafer table 2 provides support for supporting a flat wafer 3 to be placed in a beam path of the projection beam of radiation. To this end, the article handler 1 is retractable as indicated by arrows P, so that the wafer 3 can be lowered, from a clamped position above the wafer table 2, to engage protrusions 4, upon which the article handler can be further retracted to an unclamped position below the plane of support formed by the protrusions 4. Such protrusions 4 are arranged on the wafer table 2 to improve the flatness of the wafer 3 and form a bed of supporting members that support the wafer 3. Although the preceding example has been illustrated for a wafer 3, the same structure may be used for a reticle. European patent application EP0947884 describes a lithographic apparatus having an article support wherein protrusions are arranged to improve the flatness of the substrate. These protrusions have a general diameter of 0.5 mm and are located generally at a distance of 3 mm away from each other, and thereby form a bed of supporting members that support a substrate such as a wafer or a reticle. Due to the relative large spaces in between the protrusions, contaminations possibly present generally do not form an obstruction for the flatness of the substrate, since these will be lying in between the protrusions and will not lift the substrate locally. The article handler 1 is provided with an electrode 5 and a dielectric layer 6 in order to form an electrostatic clamp 7. Due to the conductive properties of, in this example, the wafer 3, a capacitive arrangement is formed, wherein the electrode 5 and wafer 3 are attracted by capacitive electrostatic forces according to the formula:

$$P_{clamp} = \frac{\varepsilon_0}{2} \left[ \frac{\varepsilon_R V}{d + g\varepsilon_R} \right]^2$$

wherein $P_{clamp}$ is the clamping pressure (Pa) exerted on the wafer 3; $\varepsilon_0$ the vacuum dielectric constant (8.84.10$^{12}$); $\varepsilon_R$ the material dielectric constant (for realistic dielectrics such as SiO$_2$ or SiN in the order of 4); V the clamping voltage; d the dielectric thickness; and g the vacuum gap.

In FIG. 2, the electrode 5 is covered with a thin dielectric layer 6, for example, an SiO$_2$ or SiN layer with a thickness of about 5 microns (ranging from about 1 microns to about 50 microns) formed on the electrode 5 as further illustrated with reference to FIG. 6. In particular, the dielectric layer 6 is preferably made of a highly resistive, durable material, since exposure of the electrode 5 could cause electric contact between the electrode 5 and the wafer 3, thereby destroying the clamping pressure. Furthermore, the electrode 5 is wired to a voltage source 8. In the preferred embodiment, the voltage source 8 is equipped with a presence detector as further illustrated with reference to FIG. 3. Between the wafer 3 and the dielectric layer 6, a gap 9 is provided (schematically indicated by a dotted line) with a thickness of about 1 microns (for instance ranging from about 0.1 microns to about 2 microns). The gap 9 avoids damage due to high clamping forces and wear. The gap 9 may be formed by protrusions 10 that are arranged on top of the electrode 5. The electrode 5 may be an Si layer that is bonded on a substrate 11 that isolates the electrode 5. The substrate 11 is bonded to a retractable cylinder 12 that protrudes through the wafer table 2. The wiring of the electrode 5 is guided through the cylinder 12. Alternatively, the wiring may be provided by printing. Also, the electrode 5 may be formed by a printed, or otherwise applied conductive layer formed on the substrate 11.

Figure 3:
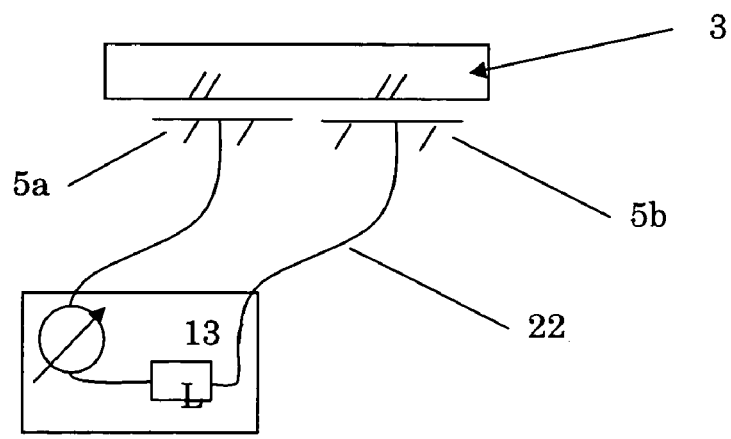
FIG. 3 depicts a schematic circuit diagram for detecting a presence of a wafer or reticle.

In FIG. 3, a schematic circuit diagram of a presence detector 13 is depicted for detecting a presence of a wafer or reticle 3. Fundamentally, the presence detector 13 detects the varying capacitance of the electrode—wafer configuration. In the embodiment shown, this is done by a bipolar electrode configuration. If the wafer 3 is present, electrodes 5a and 5b are capacitively coupled. The varying capacitance can be measured analog or digitally via well known methods, for example, in an LC circuit or the like.

Figure 4:
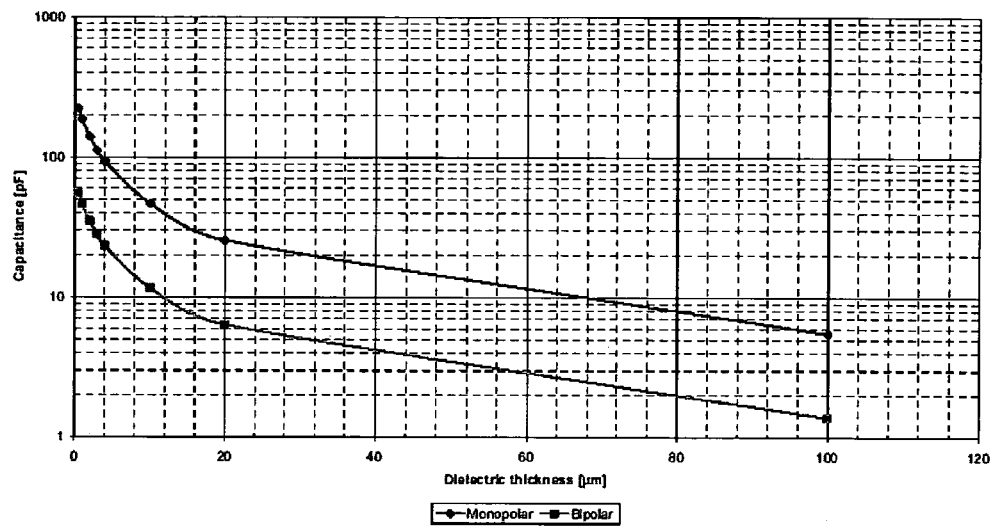
FIG. 4 depicts a diagram illustrating the relation between a measured capacity and a dielectric layer thickness.

FIG. 4 depicts the relation between a measured capacity and a dielectric layer thickness according to the formula:

$$C_{clamp} = \frac{\varepsilon_0 \varepsilon_R A}{d + g\varepsilon_R}$$

wherein $C_{clamp}$ is the measured capacitance change when an article is placed on the clamp 7; $\varepsilon_0$ the vacuum dielectric constant (8.84×10$^{12}$); $\varepsilon_R$ the material dielectric constant (for realistic dielectrics such as SiO$_2$ or SiN in the order of about 4); A the clamping area (m$^2$); d the dielectric thickness (m); and g the vacuum gap (m).

In FIG. 4, the capacitance for a monopolar or bipolar configuration is given with a gap value of about 0.5 microns. From the figure, it is apparent that preferred values for the dielectric layer are less than about 50 microns, in particular, the capacity changes are larger in the smaller thickness range of less than about 5 microns. In this range, the capacitance change from an unclamped situation (no wafer present) to a clamped situation (wafer is present) is radical and offers a reliable presence detection.

Figure 5:
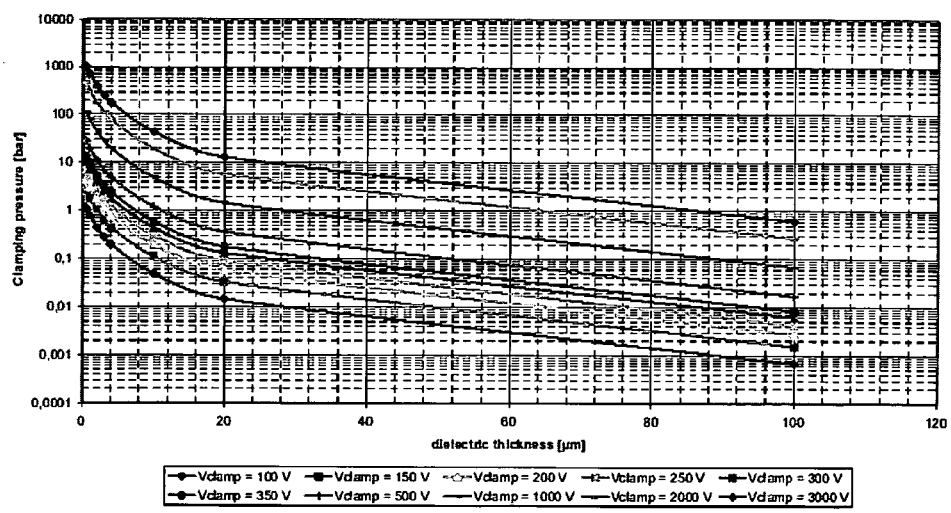
FIG. 5 depicts a diagram illustrating the relation between a clamping pressure and a dielectric layer thickness.

FIG. 5 shows another diagram, illustrating the clamping pressure in relation to dielectric layer thickness. The used clamping area of the article handler is relatively small (diameter ranging from about 0.3 to about 10 mm). Therefore, in order to provide sufficient clamping, a relatively high clamping pressure has to be provided. From the figure, it is apparent that clamping pressure increases with increasing clamping voltage and decreasing dielectric layer. Preferably, the clamping voltages are kept low, preferably below about 300 V specifically, in order to prevent damage to the electrode (breakthrough). In this range, the dielectric layer thickness is preferably less than about 50 microns, and more preferably less than about 5 microns, in order to provide a sufficient clamping pressure for handling the wafer.

Figure 6:
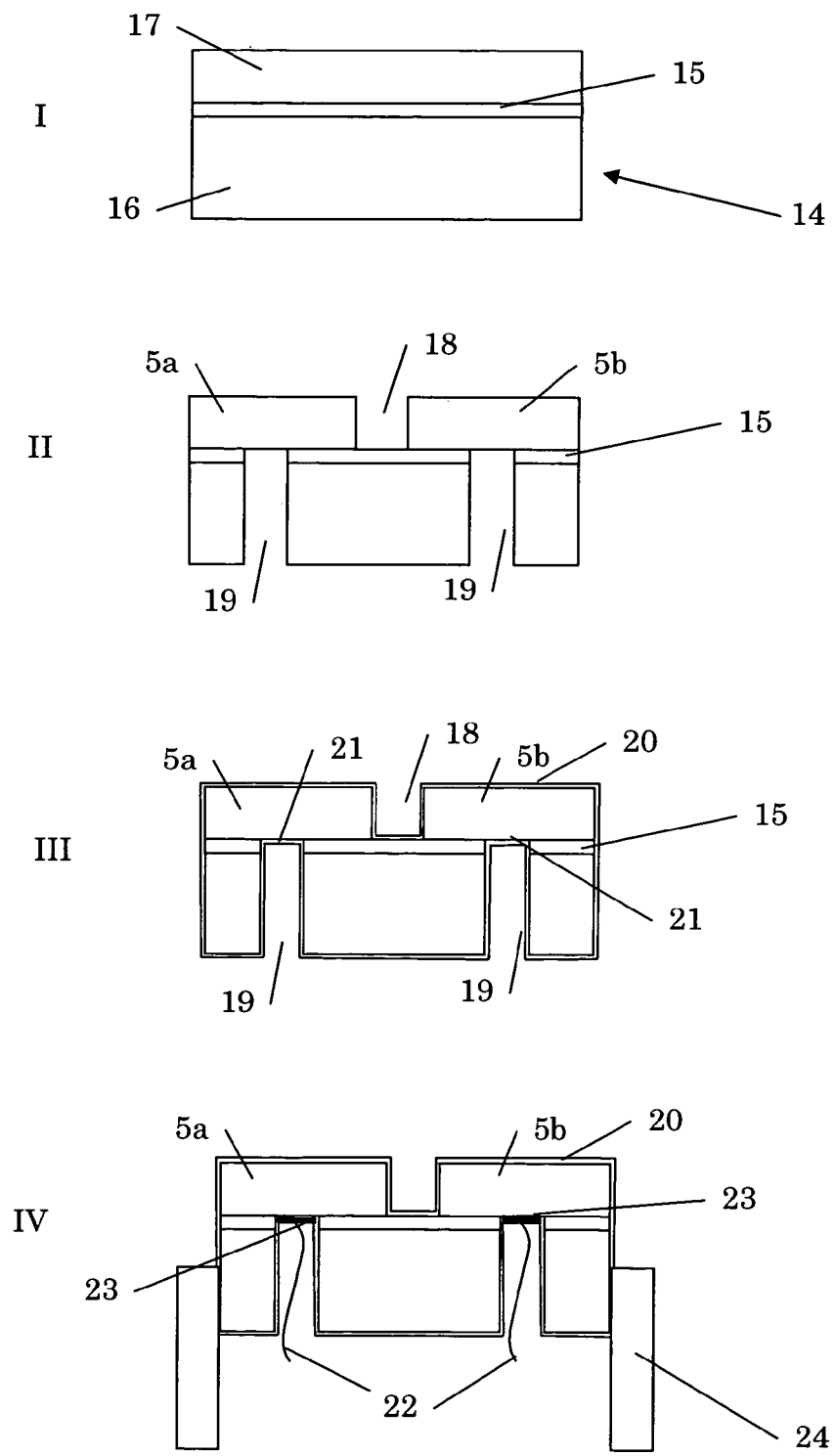
FIG. 6 depicts a diagram illustrating the manufacturing process for manufacturing the article handler according to an embodiment of the invention.

In FIG. 6, the main steps of the manufacturing scheme for manufacturing an electrostatic clamp 7 for an article handler are shown. In a first step I, a commercially available wafer 14 is provided having about a 2 microns thick SiO$_2$ layer 15 between two layers of Si. The upper Si layer 16 is about 0.2 mm thick and the lower Si layer 17 is about 0.5 mm thick. In the next step II, a series of etching steps (Reactive Ion etching) is applied to the wafer 14, thus forming the intended contour of the electrodes 5a and 5b. The electrodes 5a and 5b are separated by a division 18. The backside of the wafer 14 is also etched to provide a recess 19 extending to the respective electrodes 5a and 5b.

Then, the wafer 14 is subjected to a thermal oxidation step III, to form an $SiO_2$ layer 20 around the exposed parts of the wafer 14. Specifically, in this way, a dielectric layer is formed on top of the electrode 5, thus forming the electrostatic clamp 7.

By the thermal oxidation step, also, on the backside of the electrode 5, an insulating layer 21 is formed, which must be deleted to provide good electrical contact with the electrode.

To this end, in the final step IV, using etching, the layer 21 is removed. Furthermore, electric wiring 22 is attached to the electrode 5. To improve the electrical connection between electrode 5 and wiring 22, the recess may be filled with a conductive layer 23 (for example, an Al layer) that is bonded to the electrode 5, for example, by annealing. This layer 23 provides an excellent terminal for attaching the wiring 22 to the electrode 5.

Finally, the thus formed substrate is clamped in a housing 24 that forms part of the article handler as illustrated in FIG. 2.

The shown process FIG. 6 is a so-called Silicon on Insulator (SOI) process. Alternatively, a glass like substrate, such as pyrex, may be machined and printed with a conducting layer to form the required electrode forms. Alternatively, on the pyrex substrate, a silicon wafer may be bonded by anodic bonding, to form a substrate that can be formed and shaped by etching as explained with reference to FIG. 6.

While specific embodiments of the invention have been described above, it will be appreciated that the invention may be practiced otherwise than as described. The description is not intended to limit the invention.

What is claimed is:

1. A lithographic apparatus comprising:
   an illumination system constructed and arranged to provide a beam of radiation;
   an article support constructed and arranged to support a flat article in a beam path of the beam of radiation; and
   an article handler provided in the article support, the article handler being constructed and arranged to move said article during placement of said article on, or removal of said article from said article support, said article handler comprising an electrode and a dielectric layer in order to form an electrostatic clamp to electrostatically clamp said article.

2. A lithographic apparatus according to claim 1, wherein said article handler comprises at least three mutually distanced contact members for contacting the article.

3. A lithographic apparatus according to claim 2, wherein the contact area of said contact members is less than about 80 mm².

4. A lithographic apparatus according to claim 1, wherein said apparatus further comprises a presence detector to detect a presence of said article through a measured capacity formed by said electrode, said dielectric layer, and said article to be handled.

5. A lithographic apparatus according to claim 1, wherein said dielectric layer is wear resistant.

6. A lithographic apparatus according to claim 5, wherein the dielectric layer is provided with protrusions to provide a gap between the dielectric layer and the article to be handled.

7. A lithographic apparatus according to claim 6, wherein said gap ranges between about 0.1 and about 5 microns.

8. A lithographic apparatus according to claim 1, wherein said dielectric layer comprises at least one of $SiO_2$ and SiN.

9. A lithographic apparatus according to claim 1, wherein said dielectric layer has a thickness of less than about 50 microns, and has a dielectric constant of greater than about 3.

10. A lithographic apparatus according to claim 9 wherein said electrostatic clamp is designed to provide a clamping pressure greater than about $1.10^4$ Pa.

11. A lithographic apparatus according to claim 1, wherein said article handler comprises two electrodes.

12. A lithographic apparatus according to claim 11, wherein said electrodes are formed by an Si layer that is bonded on an isolator.

13. A lithographic apparatus according to claim 12, wherein said isolator comprises a substrate comprising an $SiO_2$ layer or a machined isolating substrate.

14. A lithographic apparatus according to claim 1, wherein said electrode comprises a metal pad bonded to said electrode in order to form a terminal for wiring said electrode.

15. A lithographic apparatus according to claim 14, wherein said metal pad is formed by an Al layer that is bonded to said electrode.

16. A lithographic apparatus according to claim 1, wherein said article support is a support to support a patterning structure, the patterning structure configured to impart the beam of radiation with a pattern in its cross-section.

17. A lithographic apparatus according to claim 1, wherein said article support is a substrate support for supporting a substrate to be patterned by a patterned beam of radiation onto a target portion of the substrate.

18. A device manufacturing method comprising:
   providing a substrate;
   moving said substrate with an article handler provided in an article support during placement of said substrate on or removal of said substrate from said article support, said article handler having an electrostatic clamp;
   detecting a presence of said substrate on said article support by detecting a capacity formed by said electrostatic clamp and said substrate;
   providing a beam of radiation using an illumination system;
   using a patterning structure to impart the projection beam with a pattern in its cross-section; and
   projecting, after detecting the presence of said substrate, the patterned beam of radiation onto a target portion of the substrate.

19. A lithographic apparatus comprising:
   an illumination system that provides a beam of radiation to an article;
   a support that supports the article in the beam of radiation;
   an article handler configured to move the article during placement of the article on, and removal of the article from, the support, the article handler being integrated with the support; and
   an electrostatic clamp configured to clamp the article to the article handler, the electrostatic clamp comprising an electrode and a dielectric layer.

20. A lithographic apparatus according to claim 19, wherein the article comprises a wafer.

* * * * *